United States Patent [19]

Morse

[11] Patent Number: 4,843,395
[45] Date of Patent: Jun. 27, 1989

[54] LARGE DYNAMIC RANGE ANALOG TO DIGITAL CONVERTER

[75] Inventor: Arthur L. Morse, Carlsbad, Calif.

[73] Assignee: Hughes Aircraft Company, Los Angeles, Calif.

[21] Appl. No.: 95,500

[22] Filed: Sep. 11, 1987

[51] Int. Cl.$^4$ ............................................. H03M 1/18
[52] U.S. Cl. ..................................... 341/156; 341/118; 341/165; 364/722; 367/66
[58] Field of Search ................................ 340/347 A-D, 340/347 CC, 347 M; 364/722; 367/65-67; 341/118, 119, 126, 138, 139, 144, 147, 155, 156, 164, 165

[56] References Cited

U.S. PATENT DOCUMENTS 4,338,589  7/1982  Engel et al. .................. 340/347 AD

FOREIGN PATENT DOCUMENTS 54-58341  4/1979  Japan ............................. 340/347 CC

OTHER PUBLICATIONS

The Engineering Staff of Analog Devices, Inc., Analog-Digital Conversion Handbook, 6/1972, pp. I-34 to I-37; I-54 to I-59; I-64 to I-67; II-52 & II-53; and II-122 to I-129.

Primary Examiner—William M. Shoop, Jr.
Assistant Examiner—Brian K. Young
Attorney, Agent, or Firm—William J. Streeter; A. W. Karambelas

[57] ABSTRACT

An analog-to-digital converter system for converting an input analog signal having a wide dynamic range to a digital output has a non-linear function generator for compressing the wide dynamic range input signal to a reduced dynamic range signal, an analog-to-digital converter of limited dynamic range for converting the reduced dynamic range signal to a digitally formatted signal, and a conversion memory for providing a digital value corresponding to the value of the wide range analog input. The digitally formatted signal addresses a word within the conversion memory, the word so addressed containing a digital value corresponding to the magnitude of the analog input signal. Each word of the conversion memory has a sufficient number of bits for expressing the desired dynamic range of the input signal. In one embodiment of the invention a digital counter and a digital to analog converter provides for calibrating the system, the output of the counter being stored in the conversion memory which, in this embodiment, is composed of RAM data storage elements.

15 Claims, 2 Drawing Sheets

FIG. 1.
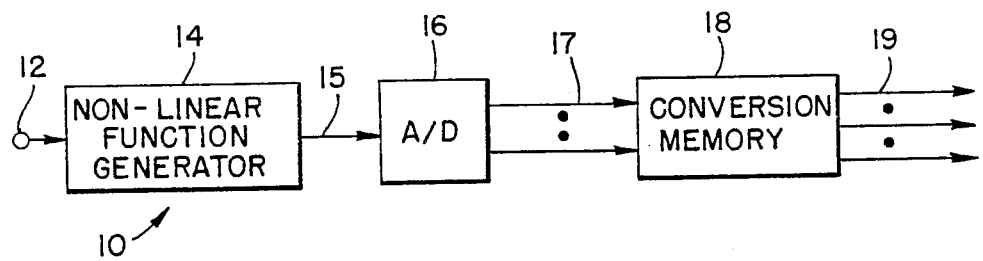
FIG. 2.
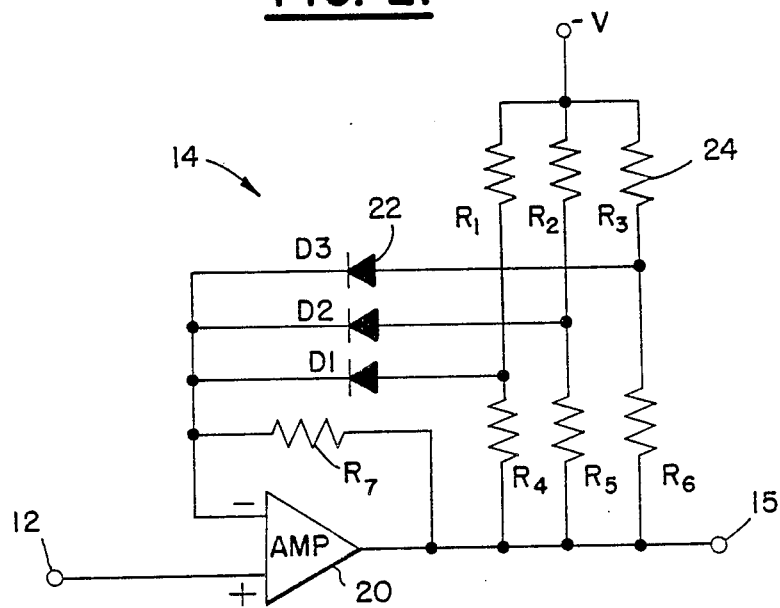
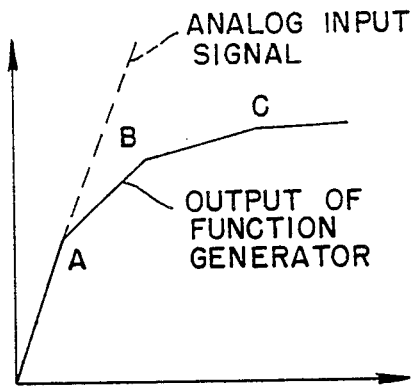
FIG. 3.

LARGE DYNAMIC RANGE ANALOG TO DIGITAL CONVERTER

BACKGROUND OF THE INVENTION

This invention relates to analog-to-digital converters and, more particularly, to an analog-to-digital converter having a large dynamic input range and a linear digital output.

An analog-to-digital converter (A/D) is commonly utilized when it is necessary to represent in digital form the magnitude of an analog signal. This is typically the case when it is desired that a digital computer be capable of determining the magnitude of an analog signal, as is often done in process-control applications. For example, if a certain process were to be controlled, and a key variable parameter of the process were a temperature, a thermocouple might be utilized to measure the temperature. The analog voltage appearing at the output of the thermocouple would be connected to an A/D converter, allowing the process control computer to determine the temperature of the process and to thereby make adjustments to the process in real-time.

One important characteristic of an A/D converter is the converter's dynamic range. The dynamic range is a measure of the magnitude range over which the input to the converter may vary.

In the process control application example given above, the temperature may vary, for example, between 0° C. and 500° C., with the corresponding output of the thermocouple varying between zero and one volt. Thus it can be seen that the A/D converter must be capable of resolving the possible one volt variation of the thermocouple input signal into a given number of bits, the number of bits being determined by the resolution of the A/D converter. A number of commercially available A/D converters readily provide eight bit resolution, thus the one volt input may be resolved into 256 discrete values. Hence the 0° C. to 50° C. range of temperatures could be determined to an accuracy of approximately 0.2° C.

A problem arises, however, when the dynamic range of the A/D converter must be increased. For example, in the previous application if it were necessary to determine the temperature over a range of 0° C. to 100° C., the output of the thermocouple may vary between zero and two volts. Inasmuch as the A/D converter may only be capable of accepting a maximum input signal of one volt, the dynamic range of the A/D converter would be exceeded. Previous approaches to utilizing a lower dynamic range converter with a higher dynamic range input signal have generally been of two types. One approach has been to provide an A/D converter having a non-linear transfer function. Thus a smaller number of output codes are required to represent the possibly large variation in the input signal. This approach however, has the disadvantages of increased circuit complexity, such as requiring non-uniform resistance ladder networks, and of a non-linear output which complicates subsequent processing by a digital computer.

Another approach to providing an A/D converter having a large dynamic range is to place a scaling amplifier ahead of the A/D converter, the purpose of the scaling amplifier to divide or compress the large dynamic range into various linear ranges, each of which has a lesser dynamic range. While this technique may crudely approximate the desired performance, it also has the disadvantage of increasing circuit complexity, component count, and power consumption.

A further problem is encountered when it is necessary to operate the A/D converter at a high conversion rate, such as when the analog signals from a large number of sources must each be scanned and digitized within a small interval of time. One such application requiring high speed conversion is the scanning and digitizing of an array of photodetectors. For example, in infrared detectors characterized by large focal plane array detectors the dynamic range of the output signal may be $2^{14}$ and higher, while the number of elements to be scanned may be several hundred or even a thousand. In this application, however, the noise associated with a signal towards the top of the dynamic range is typically many times greater than that of a signal near the bottom of the dynamic range. Properly designed compression takes advantage of this.

In order to operate at the speeds required to digitize the analog signals from a large number of sources in a short period of time, it is often necessary to utilize a flash A/D converter. However, a problem arises in that current commercially available flash A/D converters are typically limited to eight bits of resolution, which is incompatible with the $2^{14}$ dynamic range of the analog signal from the infrared detector.

In order to overcome these limitations it has been known to use several flash A/D converters in a successive approximation scheme, or to use range selection amplifiers at the front end of the A/D converter, or to use both schemes in one design. A problem arises, however, especially when the number of channels of data increases to several hundred as in the aforementioned large focal plane array detector application, in that the additional circuitry significantly increases the size, weight and power consumption of the A/D converter circuitry. This problem is especially acute in airborne applications, as when the infrared detector is carried aboard a spacecraft or an aircraft.

It may be appreciated that if a large number of data channels must be processed in a short interval of time, as when a focal plane array serves as an imager in a real-time imaging application, an additional amount of computer processing is required to convert the compressed non-linear readings back into a linear format. Such additional processing may place substantial burdens on the computer hardware and software, such as requiring faster, more complex computer components.

SUMMARY OF THE INVENTION

The foregoing problems are overcome and other advantages are realized by a high speed, large dynamic range A/D converter, in accordance with an embodiment of the invention, comprised of three relatively simple subunits. These three subunits are, typically, a limited range A/D converter, an input non-linear function generator, and a conversion memory containing output codes which linearize the output of the A/D converter. In one embodiment of the invention the output codes are fixed in a programmable read only memory (PROM) or read only memory (ROM) device. In another embodiment the codes are contained in a read/write random access memory (RAM), thus allowing the use of calibration circuitry to calibrate the output of the A/D converter whenever such calibration is required.

The relatively simple nature of the subunits allows for their integration into a single, large scale integration (LSI) integrated circuit, which provides for a large dynamic range, fast conversion A/D converter having a minimum size, weight and power consumption.

In addition, in any application where the magnitude of an associated noise signal is a function of the value of the instantaneous magnitude of the input signal, signal compression can be obtained with no loss of information. For example, the noise associated with IR detectors varies as the square root of the signal magnitude. Thus, by using a square root compression function, the A/D converter least significant output bit can be maintained approximately equal to the RMS noise.

BRIEF DESCRIPTION OF THE DRAWINGS

The foregoing features and other aspects of the invention are explained in the following description taken in connection with the accompanying drawings wherein:

FIG. 1 is a simplified block diagram showing an A/D converter in accordance with an embodiment of the invention;

FIG. 2 is a schematic diagram partially in block diagram form, showing one embodiment of a non-linear function generator of FIG. 1;

FIG. 3 is a graph of simplified form showing the relationship between the analog input signal and the output signal of the function generator.

DETAILED DESCRIPTION

Figure 4:
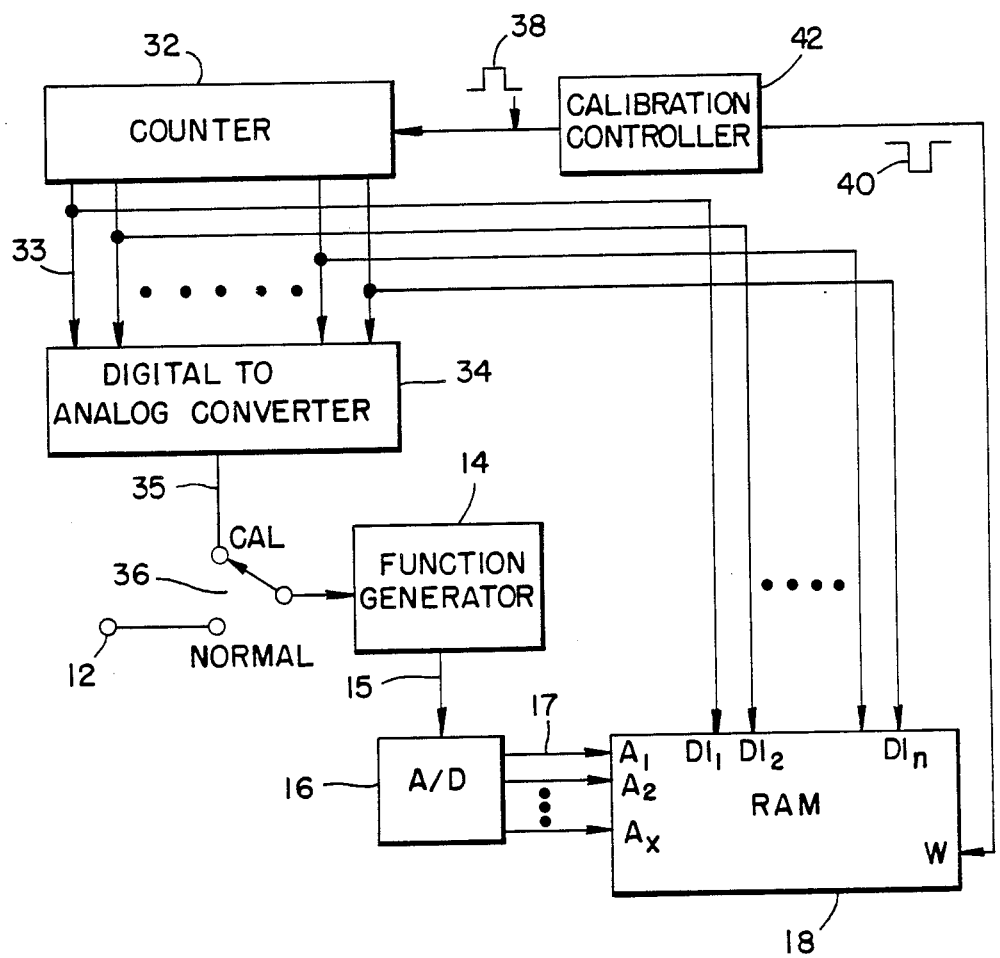
FIG. 4 is a block diagram showing calibration of the A/D converter in accordance with a feature of one embodiment of the invention.

With reference to FIG. 1 there is shown an exemplary analog-to-digital (A/D) converter system 10 comprising a non-linear function generator 14, an analog-to-digital converter (A/D) 16, and a conversion memory 18. Generator 14 compresses a high dynamic range input analog signal 12 appearing at the input into an output analog signal having a non-linear relationship to the input analog signal 12 and a lower dynamic range. The output signal 15 of function generator 14 is applied to the input of A/D converter 16, wherein the compressed analog signal is converted to an eight bit digital representation of the analog signal. The output of converter 16 comprises typically a plurality of output lines 17 corresponding to the resolution of the converter 16, a typical number being eight for an eight bit resolution converter. It should be realized, however, that the characteristics of the A/D converter 16 chosen for an application may depend on the characteristics of one of a number of suitable A/D converters which may be suitable for an application. In other words, the number of bits of resolution may vary such that the converter 16 chosen may have more or less than eight bits of resolution. It should also be realized that although converter 16 is described as having a plurality of output lines, whereby the output digital signal appears in a parallel format, it would also be possible within the scope of the invention to utilize a converter wherein the output is made in a compressed manner on a single line in a bit serial fashion. It is understood that suitable circuitry may need to be incorporated within system 10 to reformat the bit serial output into a suitable format for use by the conversion memory 18. In an application where it is necessary to transmit the data over a significant distance this bit serial format on bus 17 may be employed, thereby saving power, weight and complexity.

Conversion memory 18 linearizes the output of A/D converter 16, thereby compensating for the operation of function generator 14. Memory 18 comprises a plurality of data storage elements organized as words. The number of such words corresponds to the number of possible output codes from converter 16. For example, if converter 16 has eight output lines, memory 18 would require 256 address locations, or words, of data. The number of bits contained within each word of memory 18 is dependent on the desired resolution of system 10. Thus for a system 10 having a desired dynamic range of $2^{14}$, each word within memory 18 will contain 14 bits. The number of output lines 19 of memory 18 would therefore be required to also be 14, one line for each bit of digital data comprising a word. In use of the invention, the output lines 19 of memory 18 would be connected to, for example, a computer (not shown in FIG. 1) by conventional circuitry such that the computer may read the data appearing on lines 19, thereby determining the magnitude of the analog signal 12.

FIG. 2 shows a preferred embodiment of the function generator 14 of FIG. 1. As can be seen, function generator 14 includes an amplifier 20 operated in a negative feedback mode. A plurality of diodes 22, labeled D1, D2, and D3 respectively, and resistors 24, labeled R1 through R7 respectively, are connected within the feedback path from the output of amplifier 20 to the inverting input. The input analog signal 12 is applied to the non-inverting input of amplifier 20. An increase in magnitude of input signal 12 to the amplifier 20 results in an increase in magnitude of output signal 15 by operation of the amplifier 20. The values of series resistor pairs R1 and R4, R2 and R5, and R3 and R6 are chosen such that as the analog signal 12 and the output signal 15 of amplifier 20 increases in magnitude, diodes D1, D2, and D3, respectively, will be forward biased in succession, thus reducing the gain of amplifier 20. FIG. 3 shows that the magnitude of the output signal 15 does not increase in a linear fashion as the input signal 12 increases, but increases in a non-linear fashion composed of a succession of linear portions.

Referring to FIG. 2 in conjunction with FIG. 3 it can be seen that the output 15 of function generator 14 increases in a linear fashion, due to the feedback resistor R7, up to a point A. At this point the magnitude of output 15 is sufficient to forward bias diode D1 through the voltage divider comprised of resistors R1 and R4. Diode D1 being forward biased then conducts. When diode D1 conducts, resistor R4 is essentially placed in parallel with the feedback resistor R7, causing a decrease in the value of feedback resistance. This decrease in feedback resistance causes a corresponding decrease in the gain of amplifier 20. As the analog input signal 12 continues to increase the output 15 of generator 14 will also continue to increase, but at a lesser rate, until the magnitude of output 15 is sufficient to forward bias diode D2 through the voltage divider comprised of resistors R2 and R5. At this time diode D2 will conduct, with a consequent further reduction in the gain of amplifier 20. In like manner diode D3 will conduct if the analog signal 12 continues to increase, thereby reducing the gain of amplifier 20 still further. The points where diodes D1, D2 and D3 conduct to reduce the gain of amplifier 20 are termed the break points of the amplifier 20, and are shown as the points A, B, and C of FIG. 3. As may be well appreciated, the actual values of the break points A, B, and C are determined by the values of resistors R1–R7, and by the characteristics of diodes D1, D2, and D3. Also, while three such break points are shown in FIG. 3, it should be understood that the function generator 14 may have more or less than three break points depending on the requirements of the intended application. Of course, if more or less than three break points are required, more or less resistor and diode circuit elements will be required in the feedback path of amplifier 20.

Referring once again to FIG. 3, and in particular to the difference between the analog input signal 12 and the output signal 15 of the function generator 14, it can be seen that the overall effect of function generator 14 is to compress, or reduce, the dynamic range of the input signal 12 before it is applied to A/D converter 16.

Although a particular type of non-linear function generator 14 has been described above, it should be realized that any suitable type of generator may be utilized within the scope of the invention so long as the wide dynamic range input signal 12 may be modified such that it may be applied to A/D converter 16 without exceeding the dynamic range of converter 16.

A valuable feature of the invention is the ability to express the magnitude of the large dynamic range analog signal with a digital output linearly related to the input signal. This is attained by converting the output of A/D converter 16 by a conversion process which compensates for the non-linear operation of the function generator 14, thereby to attain a linear relationship between the output and input of the system 10. This is accomplished by the conversion memory 18.

As has been previously discussed, memory 18 is comprised of a plurality of words, each of which has a number of bits corresponding to the required resolution of the converter assembly 10. An important function of memory 18 is to convert the compressed, non-linear digital output of converter 16 into a corresponding linear value, thereby off-loading this time consuming task from the host computer. In order to accomplish this function, memory 18 contains a plurality of words expressive of digital values corresponding to values of the analog input 12. The magnitude of input signal 12, represented as a compressed, non-linear digital value by the action of generator 14 and A/D converter 16, thereby addresses a word within memory 18 having the equivalent linear value.

So that the words within memory 18 will contain the proper values to represent the equivalent magnitudes of input signal 12, converter system 10 is initially calibrated. In order to calibrate system 10 the input signal 12 may be varied such that A/D converter 16 produces all possible combinations of digital values at its output lines 17. For each such digital value the actual value of the analog signal 12 is measured and converted to its corresponding full dynamic range value expressed in digital form. This digital value forms the contents of the word at that address location within memory 18.

The data storage elements of memory 18 may be comprised of several different types of memory devices such as, for example, ROM, PROM, or RAM. If ROM or PROM is utilized, the contents of the memory is fixed. The system 10 need be calibrated once, after which the memory 18 will retain the calibration values indefinitely.

If, however, there is a possibility that the characteristics of function generator 14 or A/D converter 16 will vary over time due to, for example, component aging or temperature effects, RAM data storage elements may be utilized within memory 18. The use of RAM storage elements allows for frequent calibration, if desired, such as before each use of system 10.

FIG. 4 shows circuitry which allows for calibration of memory 18, the circuitry including a binary counter 32, digital to analog converter 34, a switch 36, and a calibration controller 42. The binary counter 32 has a number of stages or bits, which number corresponds to the dynamic range and the desired resolution of the analog input signal 12 to be measured. For example, if the dynamic range of the analog signal to be measured is $2^{14}$, counter 32 has 14 stages. The output from each stage is applied to a corresponding input of the digital to analog converter 34, the resolution of converter 34 therefore also being $2^{14}$. The purpose of converter 34 is to simulate at its output 35 the analog signal 12 which is normally applied to generator 14. The output 35 of converter 34 may be routed through a single pole/double throw switch 36 such that it may be applied to generator 14. It is understood that the switching function may be implemented by any suitable switching means, such as an electromagnetic relay, an integrated circuit FET device, or even a simple wire jumper which disconnects the analog input signal 12, allowing connection to the output of converter 34.

In operation, counter 32 is typically made to advance through a range of possible counts by a calibration controller 42 which may include a clock (not shown) for applying a series of incrementing pulses 38 to an input of counter 32. After application of each pulse 38, the output 33 of counter 32 will advance by one count. The output 33 of counter 32, being applied to converter 34, will cause the analog output 35 of converter 34 to assume an incrementally greater magnitude. Inasmuch as counter 32 counts in a linear, binary fashion, the resultant analog output 35 of converter 34 will also increase in a linear fashion, thereby simulating the linear analog input 12. It may be seen, therefore, that the binary output 33 of counter 32 bears a direct, linear relationship to the magnitude of the analog output 35 of converter 34, which is a desired result in order to calibrate the system 10 of FIG. 1.

The analog output 35, when applied to generator 14 through switch 36, is compressed in a non-linear fashion as has been previously discussed. The resulting compressed output signal 15 is applied to converter 16, thereby causing converter 16 to output a digital value corresponding to the magnitude of signal 15. This digital value forms the address of a word within memory 18 as has been previously discussed.

As can be seen in FIG. 4, the outputs 33 of counter 32 are also applied to the data inputs of memory 18, shown generally as $DI_1$ through $DI_n$, where n equals the number of bits of desired resolution. Memory 18 in this embodiment is comprised of RAM data storage elements. The typical characteristics of such a RAM memory is that data may be entered into and stored within the memory by the application on an appropriate write strobe input, shown as a pulse 40.

Thus, it can be seen that when a write strobe pulse 40 is applied to memory 18, the digital output 33 of counter 32 will be stored into the word addressed by A/D converter 16 outputs 17, the outputs being applied to the address inputs of memory 18, shown generally as $A_1$ through $A_x$, where X equals the number of bits of resolution of converter 16.

In operation, the calibration controller 42, typically a computer, contains a calibration program which causes an incrementing pulse 38 to be applied to counter 32, thereby advancing counter output 33 to the next consecutive value. This output 33 causes converter 34 to output a corresponding analog signal at output 35, which signal is applied to generator 14 and converter 16. The resulting digital output 17 of converter 16 addresses a word within memory 18. The output 33 of counter 32, which is also applied to the data inputs of memory 18, is then stored by the application by calibration controller 42 of a write strobe pulse 40. This sequence is continued until the analog output of converter 34 has been driven through at least the range of analog values which, under normal operation, are present at the input signal 12. It may be appreciated that if a computer is utilized as the calibration controller 42 that the computer may be the same computer which typically operates with the system 10 during the intended application.

It should be noted that the calibration circuit and methodology of FIG. 4 may also be used to program conversion memory 18 should it be desired to construct the memory 18 of PROM data storage elements. The write strobe pulse 40 would be replaced by an appropriate programming strobe pulse to enter data into memory 18. If a PROM data storage element is used, such a calibration procedure may only need to be accomplished once.

It should be appreciated that although the A/D converter system 10 of the invention as described is comprised of individual circuit subunits, the invention is amenable to construction as a hybridized or as a monolithic integrated circuit to achieve small size, low power consumption, and other valuable features. It should be further appreciated that the aforementioned calibration circuitry as shown in FIG. 4 may also be included within the same integrated circuit.

It should be further realized that the use of the invention is advantageous in any application where an input noise function is associated with the instantaneous value of the input analog signal. For example, the noise associated with infrared (IR) detectors typically varies as the square root of the instantaneous magnitude of the detector output. Thus, if a square root compression function is utilized to compress the dynamic range of the IR detector output, the least significant bit of the A/D converter output may be kept approximately equal to the RMS noise present at the input.

It is to be understood that the above described embodiment of the invention is illustrative only, and that modifications thereof may occur to those skilled in the art. Accordingly, this invention is not to be regarded as limited to the embodiment disclosed herein, but as to be limited only as defined by the appended claims.

What is claimed is:

1. A system for converting an analog signal into a digital representation of the analog signal comprising:
   function generator means for compressing a dynamic range of an input analog signal, said generator means producing an output analog output signal having a dynamic range which is less than the dynamic range of the input analog signal by a predetermined transfer function;
   analog-to-digital converter means for converting the output analog signal into a first digital representation of the output analog signal, said digital representation having a first predetermined number of bits; and
   conversion memory means for converting said first digital representation into a second digital representation having a value linearly related to the amplitude of the input analog signal, said second digital representation having a second predetermined number of bits being greater than the first predetermined number of bits.

2. A system as defined in claim 1 said first digital representation addresses a plurality of words within said memory means.

3. A system as defined in claim 2 wherein said second digital representation is outputted from data stored within each of said plurality of words.

4. A system as defined in claim 3 and further comprising control means, and wherein said memory means is responsive to said control means for reading out said second digital representation.

5. A system as defined in claim 4 wherein said analog-to-digital converter means comprises a flash analog-to-digital converter.

6. A system as defined in claim 1 and further comprising a calibration means switchably connected to said function generator for calibrating said system.

7. A system as defined in claim 6 wherein said calibration means comprises:
   a counter means providing a digital output;
   a digital to analog converter means for converting said digital output of said counter into an analog calibration signal suitable for calibration of said system; and
   a switch means coupled to said function generator for selectively coupling either said analog signal or said analog calibration signal to said function generator means.

8. A system as defined in claim 7 wherein said digital output of said counter means is connected to said memory means for storage of said digital output within said memory means.

9. An analog-to-digital converter system responsive to an input analog signal having an input dynamic range, said system providing a digital output signal having a predetermined number of bits expressive of a magnitude of the input analog signal, said system comprising a function generator for compressing the dynamic range of the input analog signal, said generator outputting an output analog signal having a dynamic range which is less than the dynamic range of the input analog signal; an analog-to-digital converter circuit for converting said output analog signal to an intermediate digital output signal; and a conversion memory having a plurality of storage locations addressable by said intermediate digital output signal, said storage locations containing digital data words each of which is expressive of a possible magnitude of the input analog signal, each of said words having a number of bits corresponding to the predetermined number of bits, wherein the predetermined number of bits of said digital output signal is greater than a number of bits of said intermediate digital output signal.

10. A system as defined in claim 9 wherein the input analog signal has a noise signal associated therewith, the noise signal having an instantaneous amplitude defined by a given function of the instantaneous magnitude of the input analog signal and wherein a function applied by the function generator is selected to approximate the given function whereby the noise component of the digital output signal is limited to a least significant bit of said digital output signal.

11. A system as defined in claim 10 wherein the input analog signal is generated by an IR detector, the input analog signal having an RMS noise signal having an instantaneous magnitude which varies as the square root of the instantaneous magnitude of the input analog signal and wherein said function generator is operable for compressing the input analog signal in accordance with a square root function.

12. An analog-to-digital converter responsive to an input analog signal generated by an IR detector, the input analog signal having a dynamic range, said converter having a digital output signal having a predetermined number of bits for expressing a magnitude of the input analog signal over the dynamic range of the input analog signal, said converter comprising:
function generator means for compressing the dynamic range of the input analog signal in accordance with a square root function, said generator means outputting an output analog signal having a dynamic range which is less than the dynamic range of the input analog signal;
analog-to-digital converter means for converting said output analog signal to an intermediate digital output signal; and memory means for converting said intermediate digital output signal to said digital output signal, said memory means comprising address decoding means coupled to said intermediate digital output, said memory means further comprising a plurality of storage locations addressable by said intermediate digital output signal, each of said addressable storage locations containing a digital data word which is expressive of a magnitude of the input analog signal which corresponds to a value of the output analog signal as expressed by said intermediate digital data word, each of said words having a number of bits corresponding to the predetermined number of bits, wherein the predetermined number of bits of said digital output signal is greater than a number of bits of said intermediate digital output signal and wherein the input analog signal has an RMS noise component associated therewith having an instantaneous magnitude which varies as the square root of the instantaneous magnitude of the input analog signal and wherein said function generator means is operable for compressing both the input analog signal and the RMS noise component in accordance with a square root function such that the noise component of the digital output signal is limited to a least significant bit of said digital output signal.

13. A converter as defined in claim 12 and further comprising calibration means, said calibration means comprising:
digital counter means having a plurality of outputs for expressing in a digital format an output of said counter means;
digital to analog converter means coupled to said counter means outputs for converting a value expressed by said counter means outputs to a corresponding analog calibration voltage;
means for switchably coupling to an input of said function generator means either said input analog signal or said analog calibration voltage; and
means for storing within said memory means at an address determined by said intermediate digital output for a value of said analog calibration voltage a corresponding digital data word generated by said counter means output.

14. A converter as defined in claim 13 and further comprising calibration control means having a first output coupled to said counter means for incrementing said counter means and a second output coupled to said memory means for causing said memory means to store said counter means output.

15. A converter as defined in claim 14 wherein said counter means has a number of outputs at least equal to the predetermined number of bits of said digital output signal.

* * * * *

UNITED STATES PATENT AND TRADEMARK OFFICE
CERTIFICATE OF CORRECTION

PATENT NO. : 4,843,395
DATED : June 27, 1989
INVENTOR(S) : ARTHUR L. MORSE

It is certified that error appears in the above-identified patent and that said Letters Patent is hereby corrected as shown below:

Column 8, Line 8, Claim 1, after "bits", insert
--, the second predetermined number of bits--.

Column 8, Line 10, Claim 2, after "1" insert --wherein--.

Signed and Sealed this

Twenty-first Day of May, 1991

Attest:

HARRY F. MANBECK, JR.

Attesting Officer     Commissioner of Patents and Trademarks